United States Patent [19]

Locke et al.

[11] Patent Number: 5,245,751
[45] Date of Patent: Sep. 21, 1993

[54] ARRAY CONNECTOR

[75] Inventors: Barbara E. Locke, Deep River; Lynn E. Burdick, Hampton, both of Conn.; Mark J. Owens, Phoenix, Ariz.; Michael St. Lawrence, Thompson; Scott S. Simpson, Woodstock, both of Conn.

[73] Assignee: Circuit Components, Incorporated, Tempe, Ariz.

[21] Appl. No.: 782,608

[22] Filed: Oct. 25, 1991

Related U.S. Application Data

[63] Continuation-in-part of Ser. No. 515,830, Apr. 27, 1990, Pat. No. 5,071,359.

[51] Int. Cl.$^5$ .............................................. H01R 9/09
[52] U.S. Cl. ............................................................ 29/852
[58] Field of Search .................... 29/830, 852; 427/97; 174/262-266; 439/66, 91

[56] References Cited

U.S. PATENT DOCUMENTS

| | | | |
|---|---|---|---|
| Re. 31,114 | 12/1982 | Berg | 339/17 CF |
| 2,396,725 | 3/1946 | Thomas | 173/324 |
| 2,885,459 | 11/1959 | Pulsifer | 174/35 |
| 3,192,307 | 9/1962 | Lazar | 174/68.5 |
| 3,193,789 | 7/1965 | Brown | 339/18 |
| 3,334,275 | 8/1967 | Mandeville | 317/101 |
| 3,349,480 | 10/1967 | Rashleigh | 29/624 |
| 3,351,702 | 11/1967 | Stephens | 174/68.5 |
| 3,351,816 | 11/1967 | Sear et al. | 317/101 |
| 3,351,953 | 11/1967 | Sear | 174/68.5 |
| 3,357,099 | 12/1967 | Nagy et al. | 29/625 |
| 3,436,819 | 4/1969 | Lunine | 29/628 |
| 3,465,435 | 9/1969 | Steranko | 29/628 |
| 3,499,219 | 3/1970 | Griff | 29/624 |
| 3,530,411 | 9/1970 | Sear | 333/96 |
| 3,541,222 | 11/1970 | Parks et al. | 174/68.5 |
| 3,542,939 | 11/1970 | Mintz | 174/35 |
| 3,605,063 | 3/1971 | Stewart . | |
| 3,606,677 | 9/1971 | Ryan | 29/625 |
| 3,613,230 | 10/1971 | Griff | 29/624 R |
| 3,623,037 | 11/1971 | Parks | 340/174 PW |
| 3,649,274 | 3/1972 | Older et al. | 96/36.2 |
| 3,660,726 | 5/1972 | Ammon et al. | 317/101 CM |
| 3,680,037 | 7/1972 | Nellis et al. | 339/61 |
| 3,685,145 | 8/1972 | Scarbrough | 29/604 |
| 3,704,455 | 11/1972 | Scarbrough | 340/173 SP |
| 3,705,332 | 12/1972 | Parks | 317/101 CM |
| 3,708,874 | 1/1973 | Parks | 29/604 |
| 3,739,469 | 6/1973 | Dougherty, Jr. | 29/625 |
| 3,742,597 | 7/1973 | Davis | 29/625 |
| 3,760,389 | 9/1973 | Scarbrough | 340/174 MA |
| 3,769,702 | 11/1973 | Scarbrough | 29/627 |
| 3,775,844 | 12/1973 | Parks | 29/626 |
| 3,795,037 | 3/1974 | Luttmer | 29/628 |
| 3,813,773 | 6/1974 | Parks | 29/630 R |
| 3,837,074 | 9/1974 | Griff | 29/624 |
| 3,852,878 | 12/1974 | Munro | 29/629 |
| 3,862,790 | 1/1975 | Davies et al. | 339/17 LM |
| 3,917,983 | 11/1975 | Kuronen | 317/101 CM |
| 3,934,959 | 1/1976 | Gillissen | 339/17 M |
| 3,954,317 | 5/1976 | Gillissen et al. | 339/17 E |
| 3,967,162 | 6/1976 | Ceresa et al. | 317/101 CM |
| 4,003,621 | 1/1977 | Lamp | 339/59 M |

(List continued on next page.)

FOREIGN PATENT DOCUMENTS

| | | |
|---|---|---|
| 0147856 | 12/1984 | European Pat. Off. . |
| 0213774 | 4/1985 | European Pat. Off. . |
| 2652683 | 6/1977 | Fed. Rep. of Germany . |
| 221902 | 2/1985 | Fed. Rep. of Germany . |
| 53-058672A | 5/1978 | Japan . |

OTHER PUBLICATIONS

Shin-Etsu Elastomeric Interconnectors literature.
K. S. Akkapeddi, "The Design of Some Novel (List continued on next page.)

Primary Examiner—Neil Abrams
Attorney, Agent, or Firm—Fishman, Dionne & Cantor

[57] ABSTRACT

Processes for preparing same for demateably interconnecting arrays of contact pads. The connector has a preformed sheet-form member provided with a series of apertures through each of which an electrically conductive plated metal deposit extends. An integral end of the deposits protrudes outwardly beyond a surface of the sheet-form member, forming contact surfaces for demateably engaging the pads.

21 Claims, 5 Drawing Sheets

U.S. PATENT DOCUMENTS

| | | | |
|---|---|---|---|
| 4,008,300 | 2/1977 | Ponn | 264/104 |
| 4,008,519 | 2/1977 | Gillissen et al. | 29/625 |
| 4,024,631 | 5/1977 | Castillero | 29/625 |
| 4,125,310 | 11/1978 | Reardon, II et al. | 339/92 M |
| 4,184,729 | 1/1980 | Parks et al. | 339/17 F |
| 4,199,209 | 4/1980 | Cherian et al. | 339/59 M |
| 4,225,900 | 9/1980 | Ciccio et al. | 361/395 |
| 4,236,777 | 12/1980 | Merlina et al. | 339/17 CF |
| 4,249,302 | 2/1981 | Crepeau | 29/830 |
| 4,268,956 | 5/1981 | Parks et al. | 29/869 |
| 4,283,243 | 8/1981 | Andreades et al. | 156/237 |
| 4,283,754 | 8/1981 | Parks | 361/382 |
| 4,295,700 | 10/1981 | Sado | 339/61 M |
| 4,303,715 | 12/1981 | Chang | 428/137 |
| 4,303,798 | 12/1981 | Paunovic | 174/68.5 |
| 4,312,897 | 1/1982 | Reimann | 427/96 |
| 4,323,593 | 4/1982 | Tsunashima | 427/97 |
| 4,325,780 | 4/1982 | Schulz, Sr. | 156/659.1 |
| 4,339,303 | 7/1982 | Frisch et al. | 156/629 |
| 4,360,570 | 11/1982 | Andreades et al. | 428/596 |
| 4,373,259 | 2/1983 | Motsch | 28/840 |
| 4,388,136 | 6/1983 | Huie et al. | 156/252 |
| 4,394,712 | 7/1983 | Anthony | 361/411 |
| 4,402,562 | 9/1983 | Sado | 339/61 M |
| 4,408,814 | 10/1983 | Takashi et al. | 339/59 M |
| 4,453,795 | 6/1984 | Moulin | 339/92 M |
| 4,499,655 | 2/1985 | Anthony | 29/576 |
| 4,504,783 | 3/1985 | Zasio | 324/158 F |
| 4,509,099 | 4/1985 | Takamatsu et al. | 361/413 |
| 4,529,477 | 7/1985 | Lundberg et al. | 156/659.1 |
| 4,540,229 | 9/1985 | Madden | 339/75 |
| 4,548,451 | 10/1985 | Benarr et al. | 339/17 M |
| 4,552,420 | 11/1985 | Eigenbrode | 339/14 |
| 4,4,556,759 | 12/1985 | Iadarola | 174/68.5 |
| 4,563,543 | 1/1986 | Kersuzan | 174/68.5 |
| 4,581,301 | 4/1986 | Michaelson | 428/351 |
| 4,593,961 | 6/1986 | Cosmo | 339/61 M |
| 4,608,274 | 8/1986 | Wooten | 427/96 |
| 4,610,756 | 9/1986 | Strobel | 156/645 |
| 4,631,100 | 12/1986 | Pellegrino | 156/150 |
| 4,656,314 | 4/1987 | Durand | 174/68.5 |
| 4,667,219 | 5/1987 | Lee et al. | 357/68 |
| 4,667,220 | 5/1987 | Lee et al. | 357/68 |
| 4,670,091 | 6/1987 | Thomas et al. | 156/643 |
| 4,671,854 | 9/1987 | Ishikawa et al. | 156/659.1 |
| 4,673,458 | 6/1987 | Ishikawa et al. | 156/659.1 |
| 4,675,786 | 6/1987 | Mizuko et al. | 361/398 |
| 4,681,654 | 7/1987 | Clementi et al. | 156/630 |
| 4,705,592 | 11/1987 | Bahrle et al. | 156/630 |
| 4,715,117 | 12/1987 | Enomoto | 29/851 |
| 4,715,928 | 12/1987 | Hamby | 156/630 |
| 4,720,324 | 1/1988 | Hayward | 156/645 |
| 4,737,112 | 4/1988 | Jin et al. | 439/66 |
| 4,751,126 | 6/1988 | Oodaira et al. | 428/139 |
| 4,770,900 | 9/1988 | Seibel | 427/97 |
| 4,774,126 | 9/1988 | Dorsey et al. | 428/209 |
| 4,775,573 | 10/1988 | Turek | 428/209 |
| 4,788,766 | 12/1988 | Burger et al. | 29/830 |
| 4,792,646 | 12/1988 | Enomoto | 174/68.5 |
| 4,813,129 | 3/1989 | Karnezos | 29/832 |
| 4,816,323 | 3/1989 | Inoue | 428/200 |
| 4,817,850 | 4/1989 | Wiener-Avnear et al. | 228/119 |
| 4,830,704 | 5/1989 | Voss et al. | 156/629 |
| 4,862,588 | 9/1989 | MacKay | 29/884 |
| 4,885,126 | 12/1989 | Polonio | |
| 4,891,014 | 1/1990 | Simpson et al. | 439/67 |
| 4,897,164 | 1/1990 | Piano et al. | 204/15 |
| 4,915,795 | 4/1990 | McKiel, Jr. et al. | 174/266 |
| 4,932,883 | 6/1990 | Hsia et al. | 439/66 |

OTHER PUBLICATIONS 0.050-In. Grid High-Density Circuit Pack-to-Backplane Connectors", EC Conference, 1989, pp. 92–98.

ETI Technical Data Sheet, "Matrix Moe Elastomeric Connectors", 1989.

C. A. Haque, "Characterization of Metal-in-Elastomer Connector Contact Material", IEEE Holm Conference, 1989, pp. 117–121.

W. R. Lambert et al., "Use of Anisotropically Conductive Elastomers in High Density Separable Connectors", IEEE, 1989, pp. 99–106.

E. J. Leddy, "Off-Grid Bare Board Test Technique", IEPS, 1988, pp. 403–409.

J. Lyman, "Metal-In-Elastomer Strip Interfaces to Fine-Pitch Pads", Electronics Design, 1989.

S. Jin et al., "New, Z-direction anisotropically conductive composites", J. Appl. Phys., vol. 64, No. 10, 1988, pp. 6008–6010.

L. T. Romankiw et al., "Plating Through-Holes", IBM Technical Disclosure Bulletin, vol. 9, No. 10, 1967, pp. 1255–1256.

Chung et al., "High Performance High Density Connectors Utilizing Multiple Layer Metal/Polymer Construction", 1987 Proceedings—37th Electronic Components Conference.

Howett, "An Advanced High Density Interconnect System for Military/Space Applications", 17th Annual Connectors and Interconnection Technology Symposium Proceedings (Sep. 19-21, 1984).

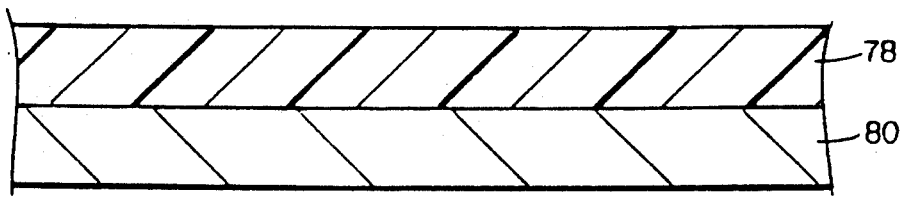
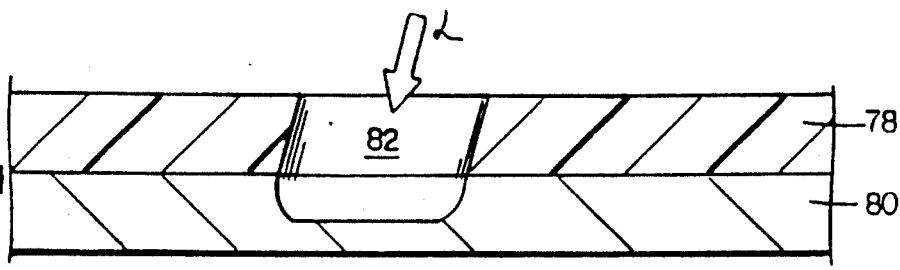
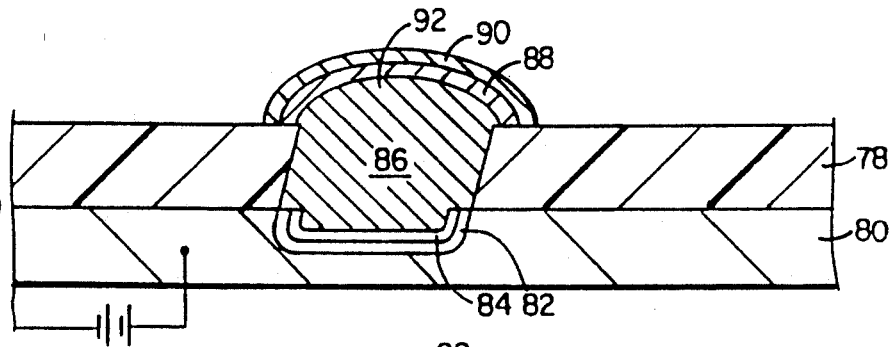
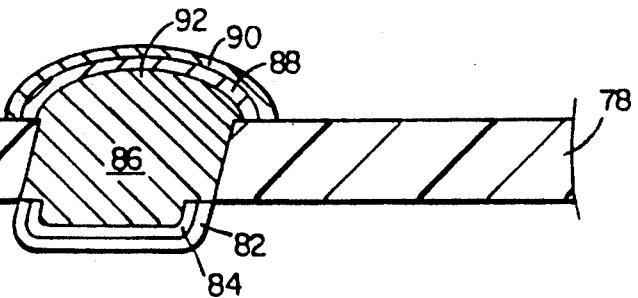

ARRAY CONNECTOR

CROSS REFERENCE TO RELATED APPLICATIONS

This application is a continuation-in-part of application Ser. No. 07/515,830, filed Apr. 27, 1990, now U.S. Pat. No. 5,071,359.

BACKGROUND OF THE INVENTION

This invention relates to interconnecting arrays of electrical contact pads.

Various common techniques for connecting integrated circuit (IC) chips to a multichip module, IC chip package, or circuit board are known. They include flip chip soldering, wire bonding, and TAB for direct IC chip attachment. Various common techniques for connecting IC chip packages to a circuit board are also known. They include surface mount soldering leadless or leaded packages, and soldering pin grid arrays. These techniques are not demateable. Various types of sockets can be used for IC chip packages which can require soldering and take up significant valuable circuit board area. These techniques are not demateable. Demateable techniques are also known.

SUMMARY OF THE INVENTION

In a first aspect, the invention features a process for fabricating a demateable electrical connector member suitable for being interposed between contact arrays of opposed members to effect electrical connection therebetween. The member is of the type comprising a polymeric sheet-form member having a plurality of apertures through which conductors of plated metal deposit extend. The process is characterized by the following steps: providing a preformed polymeric sheet-form member having oppositely directed first and second sides; providing a metal layer on the surface of the firstside of the sheet-form member; forming apertures through the sheet-form member from the second side of the sheet-form member with the apertures extending through the polymeric member to the metal layer to expose the metal layer to the interior of the aperture; connecting the metal layer to a suitable voltage source; depositing metal in the apertures by electroplating upon the exposed portion of the metal layer within the aperture to form a deposit that protrudes outwardly beyond the second side of the sheet-form member, to form a raised electrical contact on the second side; removing the metal layer sufficiently to expose the first side of the sheet-form member; temporarily electrically connecting the plated metal contacts at the second side to a suitable voltage source, depositing metal by electroplating such that plated metal protrudes outwardly beyond the first side to form a raised electrical contact on the first side of the sheet form member; and, removing the temporary electrical connection.

Various embodiments may include the following. The process further includes forming the apertures to partially extend into the metal layer forming a well; depositing into the well in order, one or more etch resistant metals, and a metal deposited to extend through the aperture above the second side of the sheet-form member, and removing the metal layer to expose the first etch resistant metal to form a raised contact region on the first side. The etch resistant metal is solder. The depositing step fills the apertures with deposited metal.

In another aspect, the invention features a process for fabricating a demateable electrical connector characterized by the following steps: providing a preformed polymeric sheet-form member having oppositely directed first and second sides; providing a layer of metal on each of the opposed first and second sides of the elastomeric sheet-form member to form a composite; forming the apertures through the thickness of the composite; depositing metal on the walls of the apertures and in electrical contact one of the metal layers; connecting the metal layer to a suitable voltage source; electroplating metal onto the metal-coated walls to form a rim around the end of each aperture that protrudes outwardly beyond the opposed sides of the composite; and removing the metal layers from the opposed sides of the sheet-form member.

Various embodiments of this aspect may include the following: Applying to the metal layers an etch resist prior to forming the apertures, and the removing step removes all of the metal layers and resist layers from the opposed sides. The depositing step deposits metal on the walls of the apertures without filling the apertures. The depositing step forms annular electrical contact regions extending outwardly from the side of said sheet-from member.

Various embodiments of any of the above aspects may also include the following. The depositing step forms a deposit that overlies a margin of the sheet-form member surrounding the aperture. The diameters of the apertures are 6 mils or less. The apertures are formed at a pitch of about 12 mils or less. The thickness of the sheet-form member is 20 mils or less. The apertures are at an acute angle to the direction of thickness of the sheet-form member. The angle is less than 15 degrees. The ratio of the pitch to polymer thickness is in the range from about 0.38 to about 1.7. The sheet-form member is selected from silicone, fluoropolymer or polyimide. The sheet-form member is preferably a yieldable elastomeric member. The elastomer preferably has a Durometer value of about 30 to about 60. The apertures are formed by laser drilling. Fine, closely spaced apertures are formed extending in X and Y directions over an area of the sheet-form member.

In general, the invention features an electrical connector for demateably interconnecting with an array of contact pads on a surface. The connector includes a preformed sheet-form member provided with a series of apertures through each of which a plated, electrically conductive metal deposit extends. An integral end of each of the deposits protrudes outwardly beyond a surface of the sheet-form member. The protruding ends are shaped to comprise electrical contact surfaces for demateably engaging the pads. Various aspects of the invention may provide a connector that includes the following. The protruding ends of the metal deposits are enlarged relative to the through-extending portions of the deposits, overlying the side of the elastomeric sheet-form member about the apertures. The enlarged protruding ends of said of said metal deposits are dome-shaped, the yieldable sheet-form member has a durometer in the range of about 30 to 60, the apertures are fine, closely spaced apertures and extending in X and Y directions over an area of the sheet-form member, the diameter of the apertures is 6 mils or less, the pitch of the apertures is 12 mils or less, and the apertures are at an angle of less than about 15 degrees to the direction of the thickness of the yieldable sheet form member. The angle may preferably be about 5 to 15 degrees for good wiping contact. The diameter of the apertures may be 4 mils or less and the pitch preferably is sufficient to interconnect arrays of contact pads that have a pitch less than 25 mils. A preferred pitch of the apertures is 8 mils or less. A preferred material for the metal deposits is copper. A preferred thickness of the sheet is 5 mils or less.

The low cost connector is capable of demateably interconnecting high density arrays of contact pads (e.g., 10 mil pitch or less). The contacts provide a wiping action for positive contact and high compliance, i.e., good connection over a wide range of thickness variations in the items contacted, under a wide range of compressions. Because of the low pitch values achievable, connectors may be formed where alignment of the connector with the contact pads is not necessary. Nor is alignment during manufacture necessary; the features, through holes or vias, may be created by, for example, accurate indexing of a laser beam or a mask. Manufacture is economical and may be automated. Additionally, the use of plating steps as described herein provides for substantially uniform extension of contacts above the elastomer surface. The pitch may be as large as 25 mils, the angle to normal as high as about 15 degrees, hole diameters may be as large as 20 mils. It is preferred that the pitch be small, preferably less than 12 mils, and more preferably less than 8 mils. Hole diameter is preferably about one half of the pitch. Also, the apertures may be normal to the substrate. Other features and advantages of the invention will be apparent from the following description of the preferred embodiments thereof and from the claims.

DETAILED DESCRIPTION

We first briefly describe the drawings.

DRAWINGS

Figure 4:
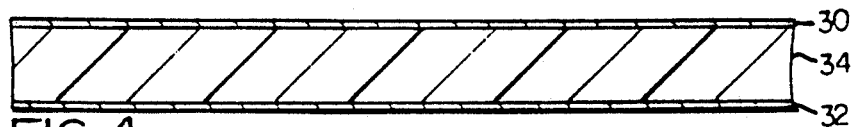
Figure 4A:
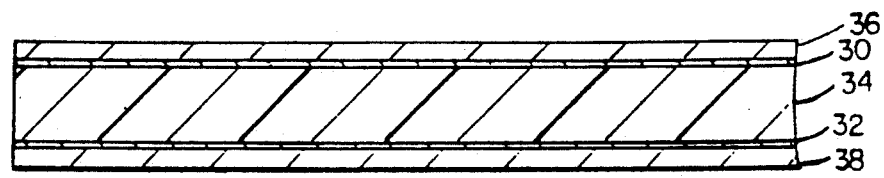
Figure 4B:
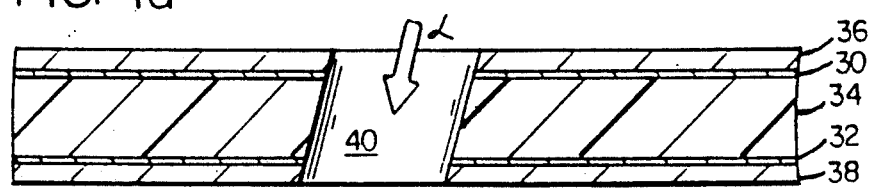
Figure 4C:
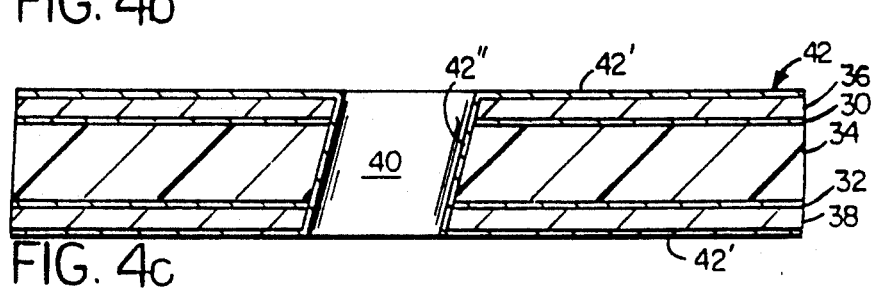
Figure 4D:
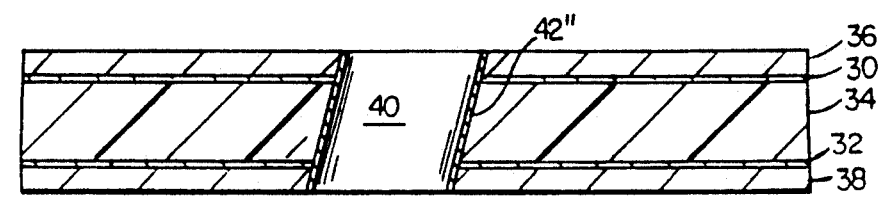
Figure 4E:
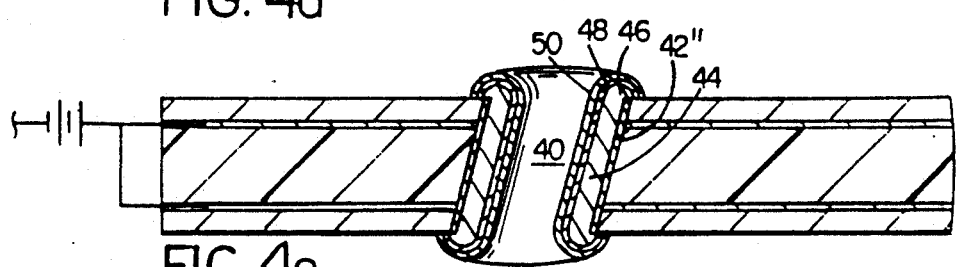
Figure 4F:
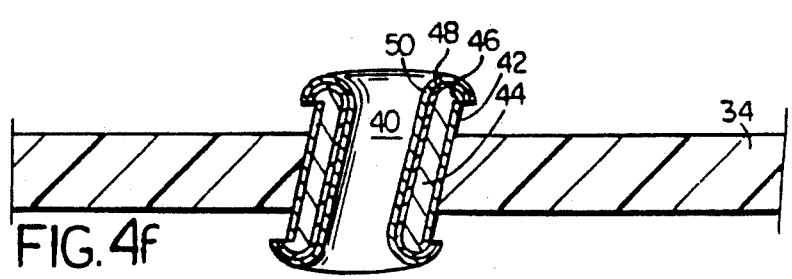
Figure 5:
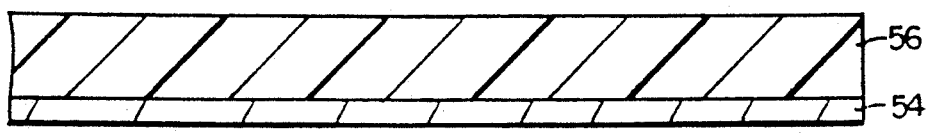
Figure 5A:
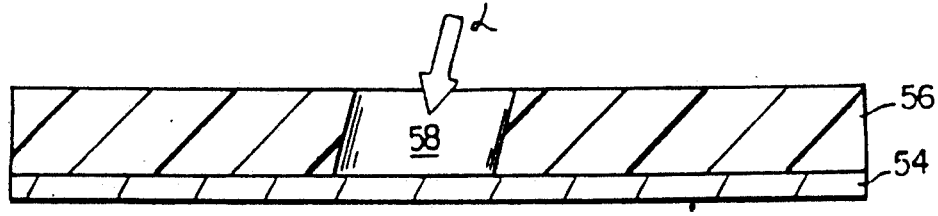
Figure 5B:
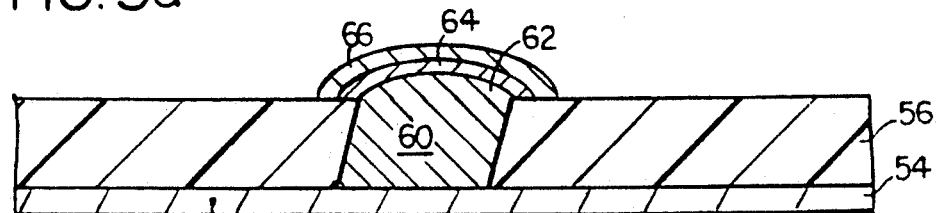
Figure 5C:
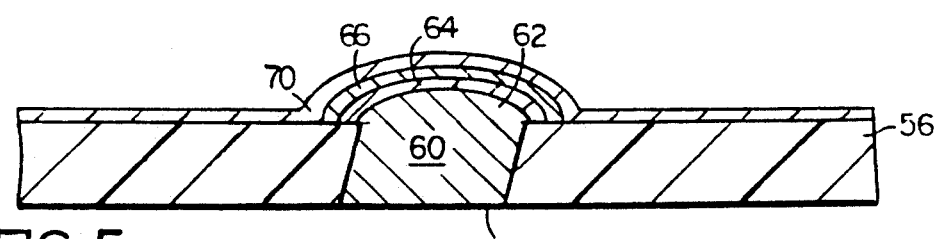
Figure 5D:
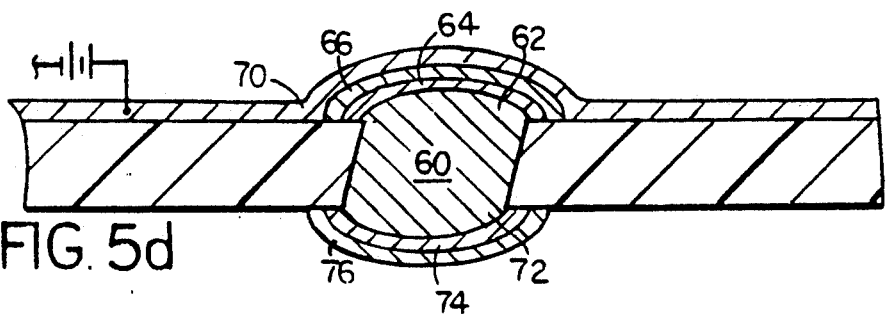
Figure 5E:
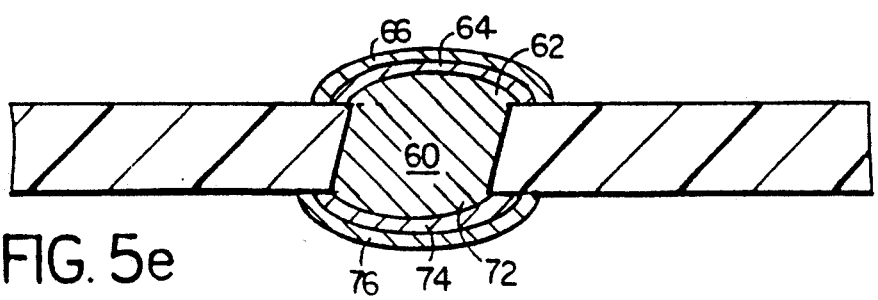

FIGS. 4—4f illustrate a process for forming a connector;

FIGS. 5-5e illustrate another process for forming a connector;

FIGS. 6-6c illustrate another process for forming a connector.

ARRAY CONNECTOR

Figure 1:
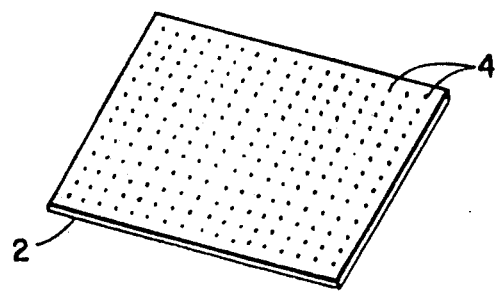
FIG. 1 is an enlarged perspective view of a connector according to the invention.

Referring to FIG. 1, a perspective view of a connector according to the invention is shown to include a thin elastomeric substrate 2 (e.g., 5 mils thick) having a series of fine (e.g., 4 mil diameter), closely spaced (e.g., 8 mil pitch), angled (e.g., 10° with respect to the elastomer surface) plated metal protrusions 4 extending through the elastomer which can make contact with contact pad arrays (not shown).

Through holes 12 are typically at an acute angle of less than about 15 degrees, e.g., 5 to 15 degrees to the normal to the plane of the surface of substrate 14 to facilitate interconnection of contact pad arrays and provide good wiping contact and recovery capability without permanent deformation. The holes may also be normal to the substrate, [In general, they are closely] and are spaced at a pitch P. [of about 3-4 mils; with this spacing,]

Figure 2:
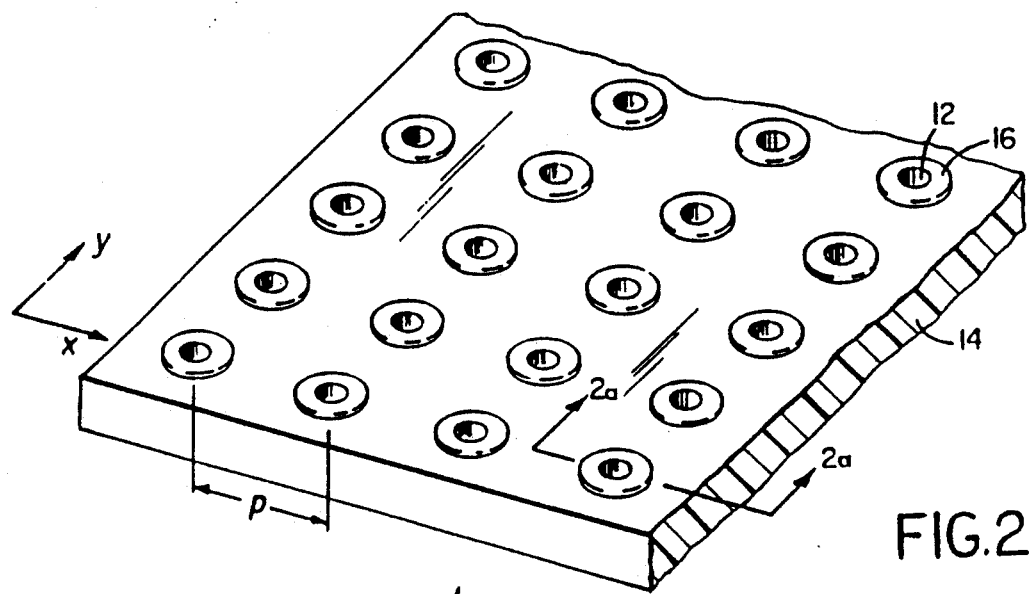
FIG. 2 is a greatly enlarged perspective view of a connector in which the walls of the apertures are plated with metal.
Figure 2A:
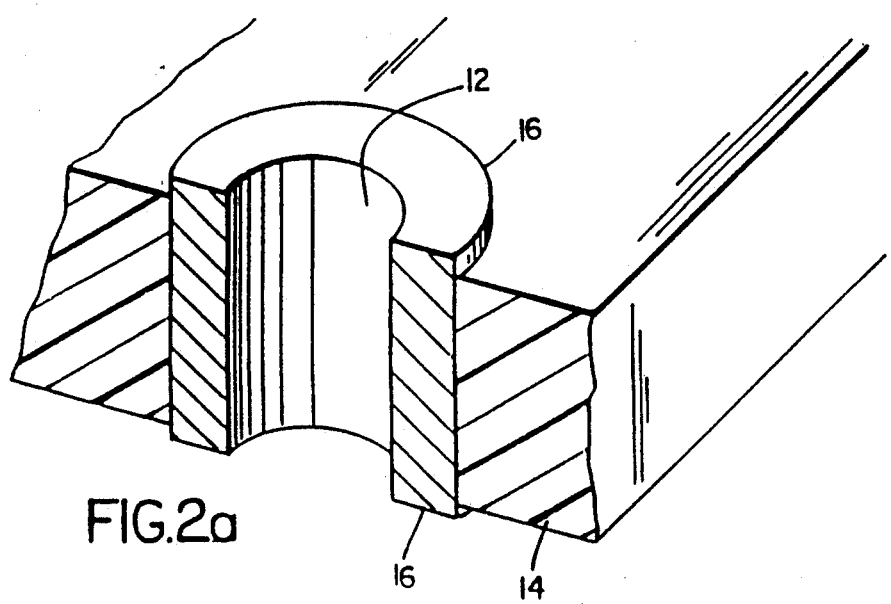
FIG. 2a is a cross-sectional view taken at 2a-2a of the connector shown in FIG. 2.

Referring to FIGS. 2 and 2a, there is shown a greatly enlarged portion of an embodiment of a connector 10 having an array of fine closely spaced through holes 12 in an electrically insulating elastomeric substrate 14. Substrate 14 is preferably a thin, solid, silicone elastomer. Typically, its thickness is about 5 mils. It may be treated to improve its adhesion to metal.

Through holes 12 extend through the thickness of substrate 14. The inner walls of holes 12 are coated with plated metal (typically copper plating followed by layers of nickel and gold for environmental protection and low contact resistance). The metal plating forms a raised rim 16 above the apertures at both ends of the through hole for establishing electrical contact with contact pad arrays (not shown).

Through holes 12 are typically at an acute angle of less than about 15 degrees, e.g., 5 to 15 degrees to the normal to the plane of the surface of substrate 14 to facilitate interconnection of contact pad arrays and provide good wiping contact and recovery capability without permanent deformation. The holes may also be normal to the substrate [In general, they are] and closely spaced at a pitch P of about 3-4 mils. With this spacing, the connector is suitable for interconnecting arrays of contact pads at 10 mil pitch (i.e. 5 mil pads with 5 mil spacing between pads) without alignment of the connector. The aspect ratio of the holes (i.e. the thickness to diameter ratio) is preferably less than 5:1 to facilitate plating. For a 5 mil thick hole (i.e. a hole extending the thickness of a 5 mil thick substrate), the hole diameter typically is about 1-2 mils.

Figure 3:
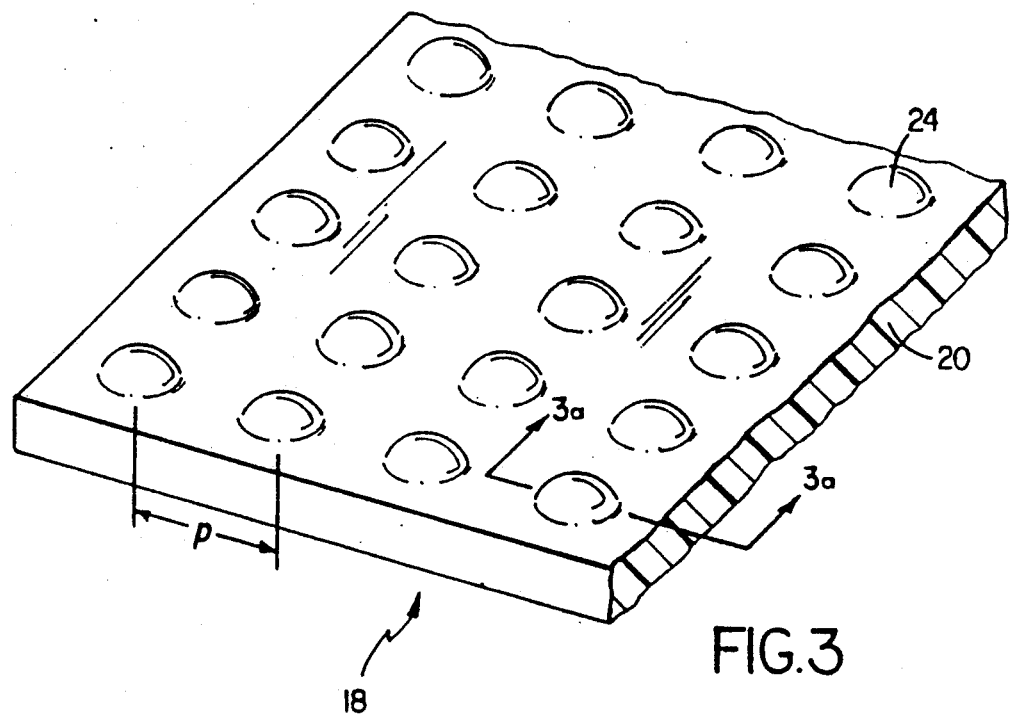
FIG. 3 is a greatly enlarged perspective view of a connector in which the apertures are filled with metal.
Figure 3A:
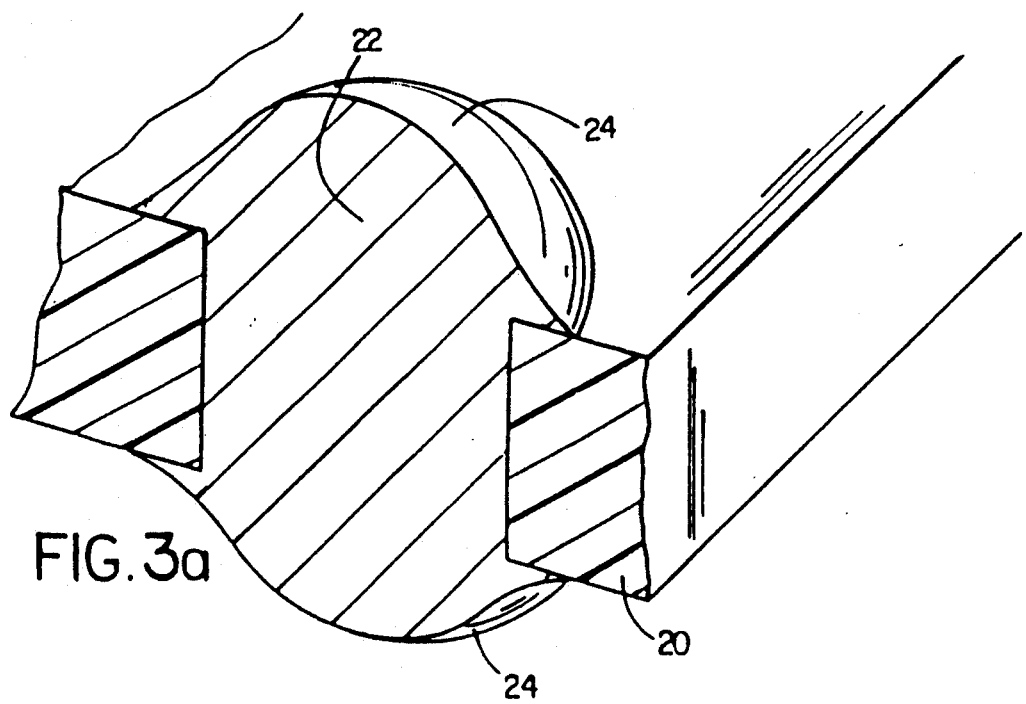
FIG. 3a is a cross-sectional view taken at 3a-3a of the connect shown in FIG. 3.

FIGS. 3 and 3a illustrate a greatly enlarged portion of a second connector structure 18 in which through holes 24 are completely filled with plated metal to form a solid plug. The ends 24 of the filled through holes protrude above the apertures at the corresponding surfaces of elastomeric substrate 20 to form bumps for electrically connecting arrays of contact pads. The dimensions of connector 18 are the same as those described above for connector 10.

The connectors of the invention may be adapted to provide reliable, demateable interconnection of, for example, chips to ceramic or plastic chip packages, chip packages to circuit boards, or circuit boards to other circuit boards. While preferred pitch values for most applications have been given hereinabove, low pitch values, e.g., as low as about 2 mils, offer an alternative to connection techniques such as TAB or wire bonding which are permanent connects for chips to chip packages, while high pitch values, e.g. as high as about 25 mils, offer an alternative to connection techniques such as surface mount soldering, pin grid arrays, flip chip soldering, or array interconnects using elastomeric substrate, for example, as discussed in U.S. Pat. No. 4,793,814 (assigned to the Assignee of the present invention) which are usually used for connection of chip packages to circuit boards.

In general, for a given pitch, the thickness of the elastomer, the aspect ratio of the through hole or via and the elastomer conformability are selected such that the connector is sufficiently resilient to provide good wiping contact and allow demateable interconnection without deformation of the contact protrusions. Finer pitch and aspect ratios, and smaller elastomer thicknesses generally reduce the resiliency of the connector. Preferably, the ratio of pitch value to elastomer thickness ranges from about 0.8 to 1.7. Preferably, the elastomer has a Durometer value ranging from about 30 to 60. The thickness of the elastomer is typically from 2 to 20 mils but may be much thicker. It will be understood that the substrate 2, 14 may be a nonelastomeric material, e.g., polyimide.

The manufacture of the connectors as discussed in detail in the Examples below, generally includes plating a metal into a through-hole or via formed in the elastomer to create a contact protrusion. The metal contact must be sufficiently bonded to or captured by the elastomer such that it does not peel away and fall out. The metal at the protrusions often tends to flare over as in a mushroom shape to overlay the surface of the substrate and hold the metal contract in place (e.g., as in FIG. 3a). It is also an important aspect of this invention that the plated metal is secured to the elastomer at the microscopic level by formation of a through hole or via that does not have perfectly smooth side walls. Such holes may be formed for example, by laser drilling. The subsequent plating of such through holes or vias creates microscopic mechanical interlocks which secure the metal to the flexible elastomer. This interlocking mechanism enables the metal contacts to be secured to the elastomer even in cases where the plating process does not produce a mushroom-like overlay of the elastomer surface (e.g., as in FIG. 2a).

Higher aspect ratios may generally be employed when using clear through holes where the metal deposits are confined to the aperture walls and an opening remains as opposed to connectors formed in blind vias as when solid plugs are formed. This is because for through holes, plating media may be circulated through the hole throughout the plating process. For clear through hole connectors, care must be taken to prevent void pockets from forming, a problem that increases with increasing aspect ratio. Nevertheless, aspect ratios as high as 30 to 1 may be obtainable for through holes where deposits are confined to the walls. For blind through holes aspect ratios of up to 10 to 1 may generally be achievable.

MANUFACTURE

The connectors described above and shown in the figures may be prepared by a process which includes plating through holes or vias in a preformed elastomeric sheet. Preferably, prior to forming the holes or vias, a composite material is formed in which the elastomeric sheet has on at least one surface a conductive coating which may serve as an electrical contact for plating within the holes or vias. The following examples are illustrative. It will be understood that the general teachings in the Examples may be combined in various ways without departing from the invention. The methods taught herein can be used with substrates other than elastomers, e.g., polyimide.

EXAMPLE 1

Referring to FIGS. 4-4f, a process is illustrated for forming a connector preferably of the type shown in FIG. 2. As shown in FIG. 4, metal layers 30, 32 such as copper are applied to the upper and lower surfaces of a silicone elastomer substrate 34, e.g., by a vacuum deposition technique such as evaporation or sputtering, to form a composite. In FIG. 4a, each copper layer 30, 32 is coated with a layer of etch resist 36, 38. Next, through holes 40 (a single hole is shown) are created as illustrated in FIG. 4b by exposing the upper surface of the composite to a laser beam. The beam may be impinged upon a mask to form a pattern of, for example, 100 holes simultaneously in the substrate in a single exposure with a number of exposures being employed to form the complete array of holes. The formation of the holes, however, requires no art work or alignment but rather simple, accurate indexing may be used, for example, with the laser mask or substrate under computer control.

In FIG. 4c once the holes 40 have been created, a copper layer 42 is vacuum deposited both onto the resist 36, 38, copper 42', and onto the walls of the holes, copper 42", to create an electrical connection for subsequent electroplating. As shown in FIG. 4d, the copper 42', deposited on top of the resist is then removed, for example, by lapping or laser ablation leaving copper 42" on the hole walls and without removing all of the resist. A copper layer 44 is then electroplated on the hole walls as indicated in FIG. 4e using the copper layers 30, 32 on each surface of the silicone elastomer as the electrical connections to the copper 42" sputtered on the hole walls. This creates a copper plated rim 46 around each hole that protrudes above the surface of the elastomer, as well as depositing copper on the hole walls. Nickel 48 and gold 50 layers are then successively electroplated on the rim 46 and the hole walls for environmental protection of the base copper and for low contact resistance.

As shown in FIG. 4f, following the electroplating operations, the resist 36, 38 is removed from both surfaces and the original copper layers 30, 32 on the elastomer surfaces are flash etched in which the nickel 48 and gold 50 plating act as an etch resist, protecting the hole walls. The surfaces of elastomer 34 are thus exposed. The net result is a silicone sheet with nickel and gold coated copper plated through holes of 1 to 2 mil diameter at 3 to 4 mil pitch. The plated copper cylinders protrude slightly above the surfaces of the silicone sheet.

The connector thus formed is particularly useful for connecting integrated circuit chips because it provides a demateable electrical connection at very high contact density. In use, a piece is cut from a larger sheet to match the outer dimensions of the contact pad arrays to be connected. It is then clamped in between the arrays using a relatively small clamping force. Alignment of the connector is not necessary because of the high pitch values possible. It will be understood that alignable contacts may also be manufactured using the teachings herein.

Variations in the above-described process are also possible. For example, some of the electroplating can be done prior to removing the vacuum deposited copper to help the copper in the holes survive the laser or lapping step.

Two different metals can be used for the metal layer adjacent to the elastomer substrate and the metal sputtered on top of the resist layer. For example, the former can be copper and the latter aluminum. In this way, selective chemical enchants (e.g., sodium hydroxide in the case of copper and aluminum) can be used to remove one metal layer without affecting the other. This procedure might be used when, for example, no etch resistant metal (gold or nickel) is plated on the copper plating in the hole walls.

A solid metal sheet can be place underneath the composite during laser drilling to deposit metal in the holes by laser ablation or evaporation of the metal from the sheet, thereby eliminating the second vacuum deposition. In this case, as the aperture angle increases, care must be taken to avoid damage of the back surface of the elastomer due to reflection of laser light from the metal.

Electroless plating can be used to deposit metal on the elastomer substrate. In this case, the resist and the elastomer must be capable of withstanding the alkaline electroless plating solutions.

Instead of lapping the metal off the resist layer prior to plating, a second resist layer can be used in between the first resist layer and the second metal layer. In this case, the resists should be dissolvable in different solvents. The second sputtered metal layer should also be thin, for example, 1000 angstroms or less to allow the solvent to penetrate through to the resist layer. In this procedure, the second resist would be dissolved, thereby removing the second sputtered metal layer but not the metal vacuum deposited in the holes for subsequent electroplating.

Following laser hole drilling, the elastomer substrate can be stretched and held in a frame for the subsequent processing step. This would reduce the aspect lo ratio of the holes (by reducing the thickness of the elastomer). It would also enable the elastomer to hold the hollow plated metal cylinders firmly in place once the tension on the sheet was removed.

It will be realized that the through holes might be plated to completely fill the through hole resulting in a connector of the type described in FIG. 3.

EXAMPLE 2

Referring now to FIGS. 5-5e, a process is illustrated for forming a connector preferably of the type shown in FIG. 3. As shown in FIG. 5, a conductive metal foil 54 such as copper is laminated to the bottom of a preformed silicone elastomer sheet 56 to form a composite. Blind vias 58 (1-2 mil diameter, one via shown) are then created by drilling through the top of the elastomer sheet with a laser until the copper layer 54 is reached as indicated in FIG. 5a. Next, as shown in FIG. 6b, copper is electroplated into the vias 58 to form solid copper segments 60 that completely fill the drilled holes and protrude outwardly from the top surface of the elastomer 56 to form a mushroom-shaped dome 62. Successive layers of nickel 64 and gold 66 are then plated on the dome.

Referring now to FIG. 5c, following the electroplating operations, the conductive copper foil 54 is removed from the bottom of the elastomer by chemical etching. This step exposes the bottom 68 of the copper segment 60 filling the through hole. As shown in FIG. 5d, a conductive layer 70 is applied to the top surface of the elastomer, e.g., by vacuum deposition followed by electroplating or by using an adhesive conductive material or conductive ink (i.e., silver particles in polymeric binder like Saran ® and a solvent) to insure sufficient electrical continuity to the solid copper segments to allow the bottom 68 of the segment 60 to be electroplated. A copper layer 72 followed by nickel 74 and gold 76 is then plated on these to from mushroom-shaped domes on this end as well. The conductive layer 70 is removed as indicated in FIG. 5e once the electroplating of layers 72, 74, 76 has been performed.

Variations in the above-described process are also possible. For example, the elastomer and conductive metal foil can be formed by curing a semi-liquid form of the elastomer to the conductive foil. It can also be prepared by vacuum depositing the conductive layer on the elastomer and then electroplating on top of the metal to the desired thickness.

The metal for the conductive foil can be different from the metal used to fill the through holes. For example, the conductive foil can be aluminum and the metal plated in the through holes can be copper. In this way, the aluminum can be easily removed without harming the plated copper segments.

EXAMPLE 3

Referring now to FIGS. 6-6c, a process is illustrated preferably for forming a connector of the type shown in FIG. 3. As shown in FIG. 6, an elastomeric substrate material 78 is provided with a metallic (preferably copper) foil layer 80 by e.g., vacuum deposition to from a composite. A blind via 82 is formed by laser irradiation as shown in FIG. 6a. During laser drilling, the conductive foil can be more or less ablated to provide a clean surface for subsequent electroplating and to form a well for plating. That is, the laser drills partially into the copper layer 80. Next, as illustrated in FIG. 6b, a gold layer 82 and nickel layer 84 are plated into the well. Onto the nickel layer 84, copper 86 is electroplated into the via until a mushroom shaped dome 92 protrudes beyond the aperture at the top surface of the substrate. Subsequently, a nickel layer 88 and a gold layer 90 are electroplated onto the protrusion. Finally, as shown in FIG. 7c, the copper 80 is removed using the gold plating 82 as a resist. Thus the well, lined with a metal other than copper protects the copper 86 during the etching of the metallic foil 80 (i.e. copper) leaving a protrusion that extends outward from the elastomer surface.

Variations of the above-described process include other platings that could be used, specifically, solder would be a very inexpensive alternative to the nickel and gold plating described earlier. Also, solder would work well when protecting the posts during the etching of the copper layer.

Other embodiments are possible. For example, it will be understood that connectors may be formed according to the invention having contacts that protrude from only one side of the substrate. The sheet form substrate member may be made from other polymers. For instance, for high temperature applications like burn-in sockets for IC chips; a fluoropolymer or polyamide can be employed and the melt point can be adjusted by including an appropriate mix of resins having different melt points such that the substrate softens enough to obtain the needed compliance but retains sufficient flow resistance to maintain good electrical contact. This connector is extremely useful for such burn-in applications because it achieves temperature capability not otherwise available in polymeric systems.

Still other embodiments are within the following claims.

We claim:

1. A process for fabricating a demateable electrical connector member suitable for being interposed between contact arrays of opposed members to effect electrical connection therebetween, the member being of the type comprising a polymeric sheet-form member having a plurality of apertures through which conductors of plated metal deposit extend, the process characterized by the steps of:
- providing a preformed polymeric sheet-form member having oppositely directed first and second sides;
- providing a metal layer on the surface of the first side of the sheet-form member;
- forming apertures through the sheet-form member from the second side of the sheet-form member, with the apertures extending through the polymeric member to the metal layer to expose the metal layer to the interior of the aperture;
- connecting the metal layer to a suitable voltage source,
- depositing metal in the apertures by electroplating upon the exposed portion of the metal layer within the aperture to form a deposit that protrudes outwardly beyond the second side of the sheet-form member to form a raised electrical contact on the second side;
- removing the metal layer sufficiently to expose the first side of the sheet-form member,
- temporarily electrically connecting the plated metal contacts at the second side to a suitable voltage source,
- depositing metal by electroplating such that plated metal protrudes outwardly beyond the first side to form a raised electrical contact on the first side of the sheet form member; and,
- removing the temporary electrical connection.

2. The process of claim 1 wherein the depositing step fills the apertures with deposited metal.

3. The process of claim 2 further comprising:
- forming the apertures to partially extend into the metal layer forming a well;
- depositing into the well in order, one or more etch resistant metals, and a metal deposited to extend through the aperture above the second side of the sheet-form member, and
- removing the metal layer to expose the first etch resistant metal to form a raised contact region on the first side.

4. The process of claim 3 wherein the etch resistant metal is solder.

5. A process for fabricating a demateable electrical connector member suitable for being interposed between contact arrays of opposed members to effect electrical connection therebetween, the member being of the type comprising a polymeric sheet-form member having a plurality of apertures through which conductors of plated metal deposit extend, the process characterized by the steps of:
- providing a preformed polymeric sheet-form member having oppositely directed first and second sides;
- providing a layer of metal on each of the opposed first and second sides of the elastomeric sheet-form member to form a composite;
- forming the apertures through the thickness of the composite;
- depositing metal on the walls of the apertures and in electrical contact with one of the metal layers;
- connecting the metal layer to a suitable voltage source;
- electroplating metal onto the metal-coated walls to form a rim around the end of each aperture that protrudes outwardly beyond the opposed sides of the composite and
- removing the metal layers from the opposed sides of the sheet-form member.

6. The process of claim 5 wherein the depositing step forms annular electrical contact regions extending outwardly from the side of said sheet-from member.

7. The process of claim 6 further comprising:
- applying to the metal layers an etch resist prior to forming the apertures, and
- the removing step removes all of the metal layers and resist layers from the opposed sides.

8. The process of claim 7 wherein the depositing step deposits metal on the walls of the apertures without filling the apertures.

9. The process of any one of claims 1, 2, 3, 5, 6 or 7 wherein the depositing step forms a deposit that overlies a margin of the sheet-form member surrounding the aperture.

10. The process of any one of claims 1, 2, 3, 5, 6 or 7 wherein the pitch of said apertures is sufficient to interconnect arrays of contact pads that have a pitch less than 25 mils.

11. The process of any one of claims 1, 2, 3, 5, 6 or 7 wherein the diameters of the apertures are 6 mils or less.

12. The process of any one of claims 1, 2, 3, 5, 6 or 7 wherein the apertures are formed at a pitch of about 12 mils or less.

13. The process of any one of claims 1, 2, 3, 5, 6 or 7 wherein the thickness of the sheet-form member is 20 mils or less.

14. The process of any one of claims 1, 2, 3, 5, 6 or 7 wherein the apertures are at an acute angle to the direction of thickness of the sheet-form member.

15. The process of any one of claims 1, 2, 3, 5, 6 wherein the angle is less than 15 degrees.

16. The process of any one of claims 1, 2, 3, 5, 6 or 7 wherein the ratio of the pitch to polymer thickness is in the range from about 0.38 to about 1.7.

17. The process of any one of claims 1, 2, 3, 5, 6 or 7 wherein the sheet-form member is a yieldable elastomeric member.

18. The process of any one of claims 1, 2, 3, 5, 6 or 7 wherein the sheet-form member is selected from silicone, fluoropolymer and polyimide.

19. The process of any one of claims 1, 2, 3, 5, 6 or 7 wherein the sheet-form member has a Durometer value of about 30 to about 60.

20. The process of any one of claims 1, 2, 3, 5, 6 or 7 comprising forming the apertures by laser drilling.

21. The process of any one of claims 1, 2, 3, 5, 6 or 7 comprising forming fine closely spaced apertures extending in X and Y directions over an area of the sheet-form member.

* * * * *